United States Patent
El-Zein et al.

(10) Patent No.: US 6,204,513 B1
(45) Date of Patent: Mar. 20, 2001

(54) HETEROSTRUCTURE INTERBAND TUNNELING DIODE

(75) Inventors: Nada El-Zein, Phoenix; Jonathan Lewis, Gilbert; Mandar R. Deshpande, Mesa, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/304,410

(22) Filed: May 4, 1999

(51) Int. Cl.$^7$ .......................... H01L 29/20; H01L 29/885
(52) U.S. Cl. ................................ 257/14; 257/12; 257/23; 257/201
(58) Field of Search ................................ 257/12, 14, 23, 257/25, 46, 201

(56) References Cited

U.S. PATENT DOCUMENTS

| | | | |
|---|---|---|---|
| 4,952,792 | * | 8/1990 | Caridi .................................. 250/211 |
| 5,132,746 | * | 7/1992 | Mendez et al. .......................... 357/4 |
| 5,294,809 | | 3/1994 | Goronkin et al. ..................... 257/17 |
| 5,449,922 | * | 9/1995 | Shen et al. ............................ 257/25 |
| 5,659,180 | | 8/1997 | Shen et al. ............................ 257/25 |

OTHER PUBLICATIONS

"Experimental Demonstration Of Resonant Interband Tunnel Diode With Room Temperature Peak–To–Valley Current Ratio Over 100", D.J. Day et al., *1993 American Institute of Physics*, J. Appl. Phys. 73(3), Feb. 1, 1993, pp. 1542–1544.

"Resonant Interband Tunnel Diodes", Sweeny et al., *Appl. Phys. Lett.* 54(6), Feb. 6, 1989, pp. 546–548.

"P–N Double Quantum Well Resonant Interband Tunneling Diode With Peak–To–Valley Current Ratio Of 144 At Room Temperature", H. H. Tsai et al., *IEEE Electron Device Letters*, vol. 15, No. 9, Sep. 1994, pp. 357–359.

"Double Quantum Well Resonant Tunnel Diodes", D.J. Day et al., *Appl. Phys. Lett.* 57(12), Sep. 13, 1990, pp. 1260–1261.

"Well Width Dependence Of Tunneling Current In Double–Quantum–Well Resonant Interband Tunnel Diodes", A.G. MacDonald et al., *IEEE Electron Device Letters*, vol. 13, No. 3, Mar. 1992, pp. 155–157.

* cited by examiner

*Primary Examiner*—Eddie C. Lee
*Assistant Examiner*—Bradley William Baumeister
(74) *Attorney, Agent, or Firm*—William E. Koch

(57) ABSTRACT

A heterostructure interband tunneling diode includes a contact layer comprising indium gallium arsenide of a first conductivity type, an injection layer comprising indium gallium arsenide of a second conductivity type, a first doped layer of the first conductivity type positioned adjacent to the contact layer, and a second doped layer of a second conductivity type juxtaposed between the first doped layer and the injection layer, wherein at least one of the first and second tunnel barrier layers comprises indium aluminium arsenide. A second embodiment includes a doped layer of the first conductivity type positioned adjacent to the contact layer, and a barrier layer positioned adjacent to the injection layer, and a quantum well layer comprising indium gallium arsenide juxtaposed between the doped layer and the barrier layer, wherein at least one of the doped and barrier layers comprises indium aluminium arsenide.

6 Claims, 3 Drawing Sheets

HETEROSTRUCTURE INTERBAND TUNNELING DIODE

FIELD OF THE INVENTION

The present invention relates in general to heterostructure interband tunneling diodes and, more particularly, to heterostructure interband tunneling diodes having high current densities.

BACKGROUND OF THE INVENTION

Tunnel diodes, where carriers tunnel through the band gap of a doped p-n junction, have taken many forms since first proposed in about 1958. Tunnel diodes provide very fast switching time and low power dissipation. The first tunnel diode, called an Esaki tunneling diode after the originator, comprised two silicon regions of different conductivity types with both being highly doped. Present day Esaki type diodes may comprise germanium, gallium arsenide, or other semiconductor material. When bias is applied to the Esaki type diode, the available states for electrons in the contact layer align with available states for holes in the valence band of the injection layer and tunneling occurs. This Esaki type diodes have low peak current densities, low peak-to-valley current ratios, and low operational frequencies.

The conventional double quantum well heterostructure interband diode comprises two doped layers sandwiched between a contact layer and an injection layer similar to the Esaki diode, but with two quantum wells, separated by a tunneling barrier layer, between the two doped layers. When sufficient bias is applied to approximately align the ground state for holes in one quantum well with the ground state for electrons in the other quantum well, tunneling occurs. Then an electron from the filled ground state can transfer to the collector layer and an electron from the injection layer can replace the transferred electron. As further bias is applied, tunneling current decreases because electron and hole states are no longer aligned. Valley current includes leakage and thermionic currents that degrade performance. Valley current increases proportionally with the bias. The band gap of the interband tunneling barrier layer substantially blocks the thermionic current which contributes to the valley current.

A high current density is also desired, but it tends to reduce peak-to-valley current ratio. Current density is current for a given area, usually given as amps per centimeter squared.

Although much progress has been made, resonant tunnel diodes have traditionally had a high peak current density with a low peak-to-valley current ratio. Heterostructure interband tunneling diodes have traditionally had the reverse, a high peak-to-valley current ratio with a lower peak current density.

Therefore, a heterostructure interband tunneling diode having a simplified structure that is easily manufactured, and having an increased current density while preserving the peak to valley current ratio is needed.

DETAILED DESCRIPTION OF THE PREFERRED EMBODIMENT

Figure 1:
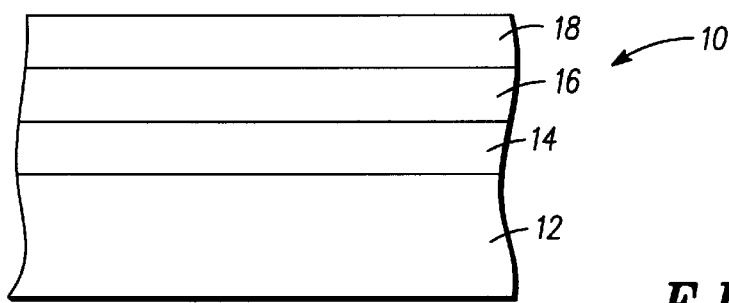
FIG. 1 illustrates a side cross sectional view of the semiconductor structure of first, second, and third embodiments of a heterostructure interband tunneling diode in accordance with the present invention.

Referring to FIG. 1, an heterostructure interband tunneling diode 10 in accordance with the present invention comprises a contact layer 12 that may be grown on a buffer layer or directly on a substrate (neither shown), for example. A first doped layer 14 of the same conductivity type as the contact layer 12, n+ for example, is grown on the contact layer 12. A second doped layer 16 and an injection layer 18 are grown, in succession, on the first doped layer 14. Second doped layer 16 and injection layer 18 are of a different conductive type (p+ for example) from the contact layer 12 and first doped layer 14. In a first embodiment, the contact layer 12 and injection layer 18 comprise indium gallium arsenide (InGaAs) and the first and second doped layers 14 and 16 comprise indium aluminium arsenide (InAlAs). Although thicknesses may be varied, for the first embodiment it is suggested the contact layer 12 be 500–1000 Å, the injection layer 18 be approximately 500 Å, while the first and second doped layers 14 and 16 be greater than 100 Å.

The use of InAlAs for the first and second doped layers 14 and 16 provides diode characteristics of a reasonable current density while maintaining a good peak-to-valley current ratio. Current density is current for a given area, usually given as amps per centimeter squared.

Figure 2:
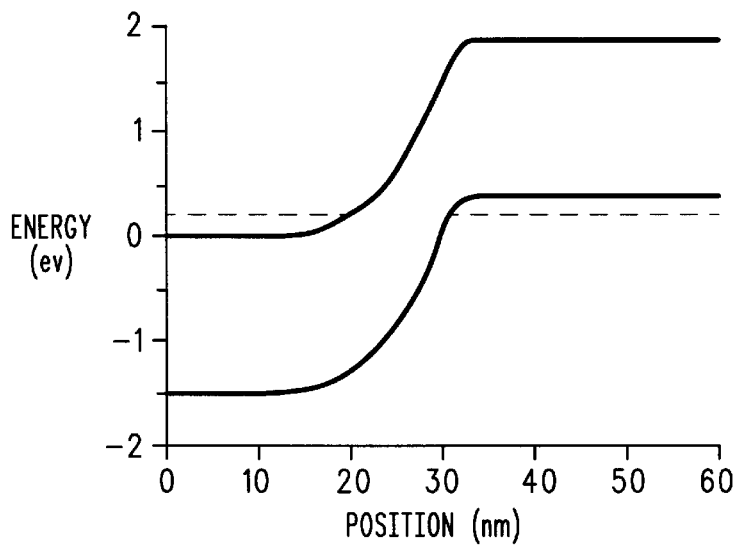
FIG. 2 illustrates the energy band diagram for the heterostructure interband tunneling diode of the first embodiment without contact and injection layers.
Figure 3:
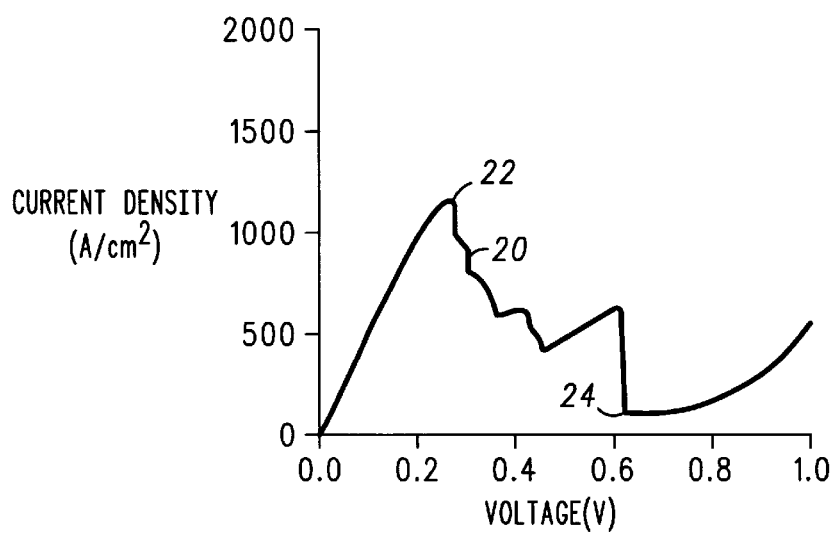
FIG. 3 illustrates the DC characteristics for the heterostructure interband tunneling diode of the first embodiment.

Referring to FIGS. 2 and 3, a schematic energy band diagram and the DC characteristics, respectively, for the first embodiment of FIG. 1 are shown. When bias is applied to the first embodiment, the available states for electrons in the doped layer 14 align with available states for holes in the valence band of the doped layer 16 and tunneling occurs.

Current-voltage characteristics of the heterostructure interband tunneling diode 10, first embodiment, are illustrated as line 20 in FIG. 3. Peak voltage and current occur at point 22 and valley voltage and current occur at point 24. The peak-to-valley ratio (PVR) is the peak current at 22 divided by the valley current at 24.

Again referring to FIG. 1, a second embodiment comprises a contact layer 12, a second doped layer 16 having a low bandgap (p+), and an injection layer 18 grown with InGaAs and first doped layer 14 having a high bandgap grown with InAlAs (n+). This structure provides a current density of about 6,500 amps/cm$^2$ and a PVR of about 5.

Figure 4:
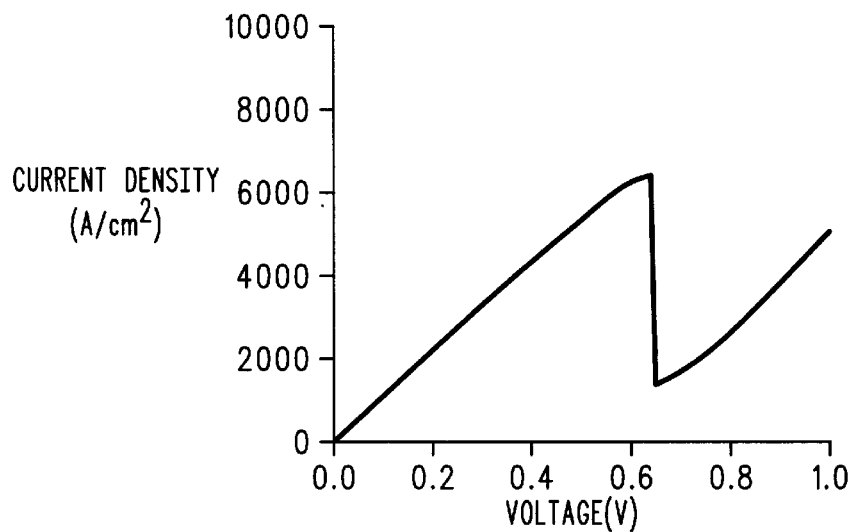
FIG. 4 illustrates the DC characteristics for the heterostructure interband tunneling diode of the second embodiment.

FIG. 4 illustrates voltage-current characteristics of the second embodiment.

Yet a third embodiment comprises contact layer 12, first doped layer 14 having a low bandgap (n+), and injection layer 18 grown with InGaAs and second doped layer 16 having a high bandgap grown with InAlAs (p+).

Figure 5:
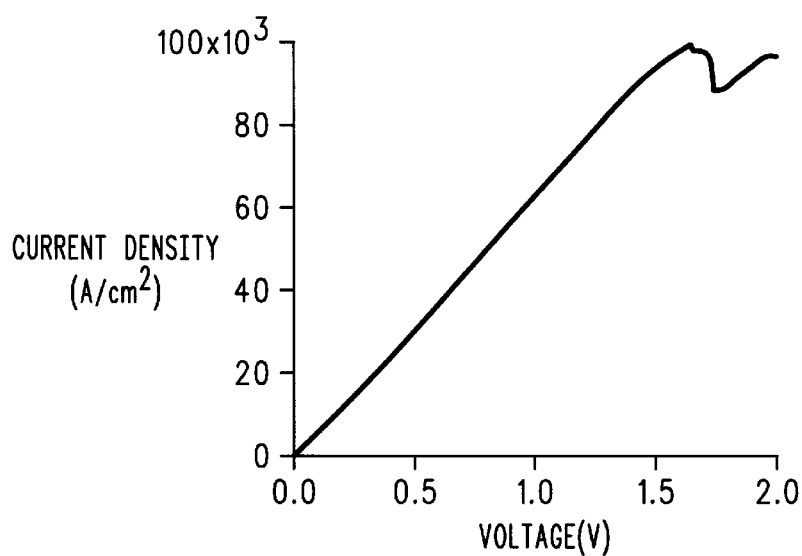
FIG. 5 illustrates the DC characteristics for the heterostructure interband tunneling diode of the third embodiment.

FIG. 5 illustrates voltage-current characteristics of the third embodiment. InGaAs has a small bandgap providing high mobility and a high current density. The low bandgap layer 14 is doped with n+, providing a lower tunnel barrier. This structure has provided a current density of 100,000 amps/cm$^2$ at the valley voltage. The PVR has not been measured since the peak current density is very high and a proper measuring system was not available.

Figure 6:
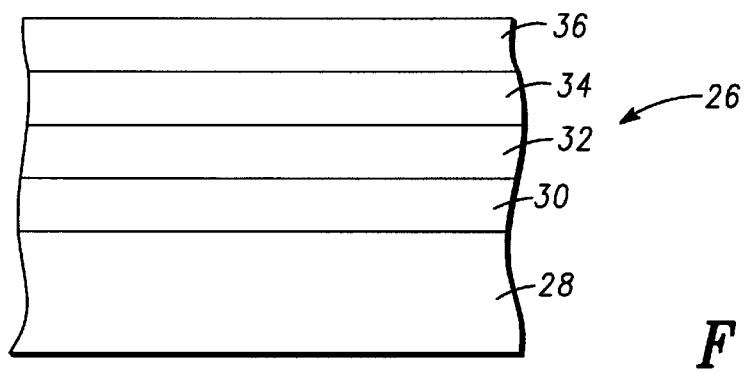
FIG. 6 illustrates a side cross sectional view of the semiconductor structure of a fourth embodiment of a heterostructure interband tunneling diode in accordance with the present invention.

Referring to FIG. 6, a heterostructure interband tunneling diode 26 in accordance with a fourth embodiment of the present invention comprises a contact layer 28 that may be grown on a buffer layer or directly on a substrate (neither shown), for example. A first doped layer 30 having a high bandgap of the same conductivity type as the contact layer 28, n+ for example, is grown on the contact layer 28. A quantum well layer 32 and a barrier layer 34 are grown, in succession, on the doped layer 30. Then, an injection layer 36 is grown on the barrier layer 34. The contact layer 28 and doped layer 30 are of a different conductive type (n+ for example) from the injection layer 36. The barrier layer 34 and quantum well layer 32 are not intentionally doped. In one embodiment, the contact layer 28, injection layer 36, and the quantum well layer 32 comprise indium gallium arsenide (InGaAs) and the doped and barrier layers 30 and 34 comprise indium aluminium arsenide (InAlAs).

Figure 7:
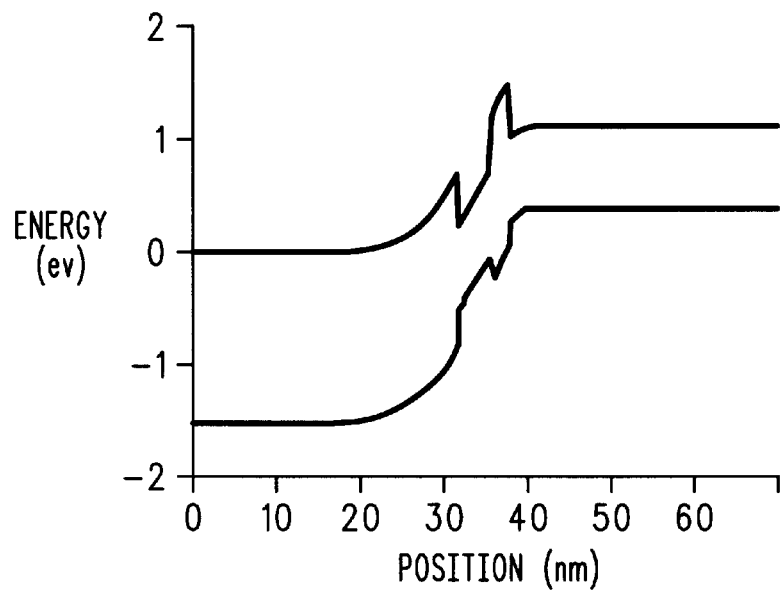
FIG. 7 illustrates the energy band diagram for the heterostructure interband tunneling diode of the fourth embodiment without contact and injection layers.
Figure 8:
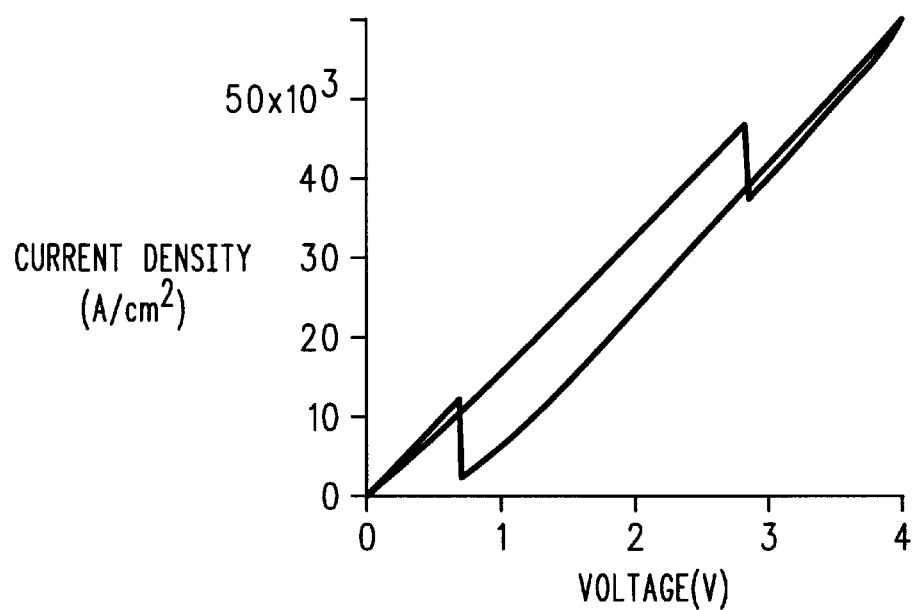
FIG. 8 illustrates the DC characteristics for the heterostructure interband tunneling diode of the fourth embodiment.

FIGS. 7 and 8 illustrate the energy band diagram without the contact layer, and the DC characteristics, respectively, of the single well heterostructure interband tunneling diode 26.

What is claimed is:

1. A heterostructure interband tunneling diode, comprising:

a contact layer comprising indium gallium arsenide of a first conductivity type;

an injection layer comprising indium gallium arsenide of a second conductivity type;

a doped layer of the first conductivity type positioned adjacent to the contact layer and having a bandgap higher than that of the contact layer; and a barrier layer positioned adjacent the injection layer, wherein at least one of the doped and barrier layers comprises indium aluminium arsenide; and a quantum well layer comprising indium gallium arsenide juxtaposed between the doped layer and the barrier layer.

2. The heterostructure interband tunneling diode of claim 1 wherein both the doped and barrier layers comprise indium aluminium arsenide.

3. A heterostructure interband tunneling diode, comprising:

a contact layer comprising indium gallium arsenide of a first conductivity type and having a first side;

a doped layer of the first conductivity type having a first side positioned adjacent to the first side of the contact layer;

a quantum well layer comprising indium gallium arsenide having a first side positioned adjacent to a second side of the doped layer;

a barrier layer comprising indium aluminium arsenide having a first side positioned adjacent to a second side of the quantum well layer, wherein at least one of the doped and barrier layers comprises indium aluminium arsenide; and an injection layer comprising indium gallium arsenide of a second conductivity type positioned adjacent to a second side of the barrier layer.

4. The heterostructure interband tunneling diode of claim 3 wherein the quantum well layer comprises a thickness of between 30 Å to 50 Å.

5. The heterostructure interband tunneling diode of claim 4 wherein the barrier layer comprises a thickness of between 10 Å to 30 Å.

6. We heterostructure interband tunneling diode of claim 5 wherein the doped layer comprises a thickness greater than 100 Å.

* * * * *

UNITED STATES PATENT AND TRADEMARK OFFICE
CERTIFICATE OF CORRECTION

PATENT NO. : 6,204,513 B1  
DATED : March 20, 2001  
INVENTOR(S) : Nada El-Zein et al.

Page 1 of 1

It is certified that error appears in the above-identified patent and that said Letters Patent is hereby corrected as shown below:

<u>Column 4</u>,  
Line 35, delete "We" and add -- The --.

Signed and Sealed this

Twenty-third Day of April, 2002

Attest:

Attesting Officer

JAMES E. ROGAN  
*Director of the United States Patent and Trademark Office*